(12) United States Patent
Hashimoto et al.

(10) Patent No.: US 8,197,294 B2
(45) Date of Patent: Jun. 12, 2012

(54) ORGANIC EL LIGHT-EMITTING DEVICE AND PRODUCTION METHOD THEREOF

(75) Inventors: Morimi Hashimoto, Wako (JP); Masahiro Nakanishi, Yokohama (JP); Toshihiko Mimura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 80 days.

(21) Appl. No.: 12/398,278

(22) Filed: Mar. 5, 2009

(65) Prior Publication Data

US 2009/0253331 A1 Oct. 8, 2009

Related U.S. Application Data

(62) Division of application No. 11/548,846, filed on Oct. 12, 2006, now Pat. No. 7,503,823.

(30) Foreign Application Priority Data

Dec. 13, 2005 (JP) .................................. 2005-358619
Oct. 3, 2006 (JP) .................................. 2006-271542

(51) Int. Cl.
*H01J 51/00* (2006.01)
(52) U.S. Cl. .......................................... 445/24; 313/512
(58) Field of Classification Search .......... 313/498–512; 445/24–25
See application file for complete search history.

(56) References Cited

U.S. PATENT DOCUMENTS

| | | | |
|---|---|---|---|
| 6,762,552 B1 | 7/2004 | Duineveld et al. | 313/506 |
| 6,833,156 B2 | 12/2004 | Miyashita et al. | 427/66 |
| 6,838,192 B2 | 1/2005 | Miyashita et al. | 428/690 |
| 6,863,961 B2 | 3/2005 | Miyashita et al. | 428/203 |
| 6,954,031 B2 | 10/2005 | Hashimoto et al. | |
| 7,102,280 B1 | 9/2006 | Duineveld et al. | |
| 7,192,334 B2 | 3/2007 | Hashimoto et al. | |
| 2002/0136823 A1 | 9/2002 | Miyashita et al. | 427/66 |
| 2004/0017152 A1 | 1/2004 | Hashimoto et al. | |
| 2004/0119066 A1 | 6/2004 | Han et al. | 257/40 |
| 2004/0144975 A1 | 7/2004 | Seki et al. | 257/40 |
| 2005/0042477 A1 | 2/2005 | Miyashita et al. | 428/690 |
| 2006/0009133 A1 | 1/2006 | Hashimoto et al. | |

FOREIGN PATENT DOCUMENTS

| | | |
|---|---|---|
| JP | 10-153967 | 6/1998 |
| JP | 2002-075640 | 3/2002 |
| JP | 2003515909 A | 5/2003 |
| JP | 2004111354 A | 4/2004 |
| JP | 2007095521 A | 4/2007 |
| WO | 0141229 A1 | 6/2001 |

*Primary Examiner* — Anne Hines
(74) *Attorney, Agent, or Firm* — Fitzpatrick, Cella, Harper & Scinto

(57) ABSTRACT

There is provided a method of producing an organic EL light-emitting device which enables prevention of crosstalk between adjacent pixels of the same color. Provided is a method of producing an organic EL light-emitting device which has banks provided in a row direction and in a column direction, and a plurality of organic EL light-emitting portions isolated from each other by the banks. The method includes the steps of forming banks such that a height of a bank portion of a row direction and a height of a bank portion of a column direction are different from each other; and applying an organic EL material in a continuous manner along the bank portion which is higher of the bank portion of the row direction and the bank portion of the column direction, between the banks of the higher bank portion.

3 Claims, 8 Drawing Sheets

51

52

ORGANIC EL LIGHT-EMITTING DEVICE AND PRODUCTION METHOD THEREOF

CROSS-REFERENCE TO RELATED APPLICATIONS

This application is a divisional application of U.S. application Ser. No. 11/548,846, filed Oct. 12, 2006 now U.S. Pat. No. 7,503,823, which claims priority of Japanese Patent Application No. 2005-358619, filed on Dec. 13, 2005 and Japanese Patent Application No. 2006-271542, filed on Oct. 3, 2006 under 35 U.S.C. §119. The contents of all of the aforementioned applications are hereby incorporated by reference herein in their entireties.

BACKGROUND OF THE INVENTION

1. Field of the Invention

The present invention relates to an organic electroluminescence (hereinafter, simply referred to as "EL") light-emitting device utilizing EL of an organic compound material which emits light when current is injected therein, and a production method thereof. More particularly, the present invention relates to an organic EL light-emitting device having banks for isolating pixels, and a production method thereof.

2. Description of the Related Art

In the production of the organic EL light-emitting device, which is promising for a large-area display, an organic EL light-emitting material has been applied to a large-size substrate in an attempt to reduce the production cost.

Japanese Patent Application Laid-Open No. H10-153967 discloses a method of fabricating a light-emitting device using an inkjet system, which is a typical method for applying such a material. The method is described below.

As shown in FIG. 8, transparent anode electrodes 82 made of indium tin oxide (hereinafter referred to as "ITO") or the like are fabricated on a transparent substrate 81 using photolithography. Then, "banks" 83 (of polyimide, for example) for pixel isolation having high electrical insulation properties are formed between the transparent electrodes 82 using photolithography. Then, layers, such as a hole injection layer and a light-emitting layer, are formed in the mentioned order in each of the pixels, by dropping and coating with the aid of an inkjet system. At this time, the height of each of the "banks" needs to be sufficiently large with respect to the thickness of the organic EL layer. The purpose of this is to prevent such a phenomenon that when an organic EL material is ejected from a nozzle 85 of an inkjet system (not shown) and arrives at each of the pixels, a part of the material bounces from the substrate to be scattered to the periphery of the pixel and be mixed into an adjacent organic EL material across the bank. In the figure, reference characters 84a, 84b, and 84c denote organic EL materials for red, blue, and green, respectively. Further, as shown in FIGS. 9A and 9B, banks 91 of a column direction and banks 92 of a row direction are formed into shapes for surrounding each of the pixels for accomplishment of isolation between the pixels. In the figures, reference characters 93a, 93b, and 93c denote organic EL materials for red, blue, and green, respectively. Thus, as disclosed in Japanese Patent Application Laid-Open No. H10-153967, in the case of the inkjet system, the heights of the "banks" are substantially identical at any location (i.e., h5=h6 in FIG. 9B).

Next, Japanese Patent Application Laid-Open No. 2002-075640 discloses a method of fabricating a light-emitting device using the so-called nozzle printing, which is another method for applying an organic EL material. The method is described below.

As shown in FIG. 6, after forming transparent anode electrodes 62 made of ITO on a transparent substrate 61 by using photolithography, "banks" 63 suitable for nozzle printing and for pixel isolation formed in a striped pattern (corresponding to banks 73 of a column direction in FIG. 7) by photolithography. In this case, the heights of the banks need to be sufficiently large to such an extent that required amounts of applied inks (organic EL materials 64a, 64b, and 64c for red, blue, and green, respectively) do not get over the banks 63 and to also be substantially identical at any location (see FIG. 6). A nozzle 65 is moved at a high speed along the striped banks 73. The characteristic of the nozzle printing is that the viscosity and pressure of a solution (for example, organic EL material 64 for red) are adjusted, so that a required amount of the solution can be dropped into a groove portion between banks with one ejection. That is, by continuously dropping the organic EL material in the groove (without any break, as in the case of drawing a continuous line with a single stroke of an ink pen), the problem of "contamination of ink (color mixing) due to bouncing back of liquid droplet across bank" in the ink jet system is overcome. The technique of dropping an organic EL material in a groove in a continuous manner (without any break, as in the case of drawing a continuous line with a single stroke of an ink pen) is hereinafter referred to as "nozzle printing".

However, as disclosed in Japanese Patent Application Laid-Open No. 2002-075640, in the case of the nozzle printing, because the "banks" 73 are provided in the striped pattern (see FIG. 7), there is no physical isolation between pixels of the same color disposed in a direction 76 in which the relative positional relationship between a nozzle 75 and a formed film-shaped member changes (hereinafter referred to as "scanning direction"). Accordingly, there is posed the problem of crosstalk between adjacent pixels of the same color. The crosstalk is attributable to the transmission of light emitted by a light-emitting layer between adjacent pixels of the same color through organic compound layers, such as the light-emitting layer, a hole-transporting layer, and an electron-transporting layer.

SUMMARY OF THE INVENTION

It is, therefore, an object of the present invention to provide a method of producing an organic EL light-emitting device, which is capable of preventing crosstalk between adjacent pixels of the same color.

The present invention provides a method of producing an organic EL light-emitting device having banks provided in a row direction and in a column direction, and a plurality of organic EL light-emitting portions isolated from each other by the banks, the method comprising the steps of: forming banks such that a height of a bank portion of a row direction and a height of a bank portion of a column direction are different from each other; and applying an organic EL material in a continuous manner along the bank portion which is higher of the bank portion of the row direction and the bank portion of the column direction, between the banks of the higher bank portion.

Further, the present invention also provides an organic EL light-emitting device which comprises banks provided in a row direction and in a column direction, and a plurality of organic EL light-emitting portions isolated from each other by the banks, wherein a height of a bank portion of the row direction and a height of a bank portion of the column direction are different from each other.

According to the present invention, an organic EL material is applied by the nozzle printing in a state in which low banks (banks of a row direction) are formed in a direction which intersects the scanning direction, whereby crosstalk between adjacent pixels of the same color can be prevented.

Further features of the present invention will become apparent from the following description of exemplary embodiments with reference to the attached drawings.

DESCRIPTION OF THE EMBODIMENTS

Figure 1A:
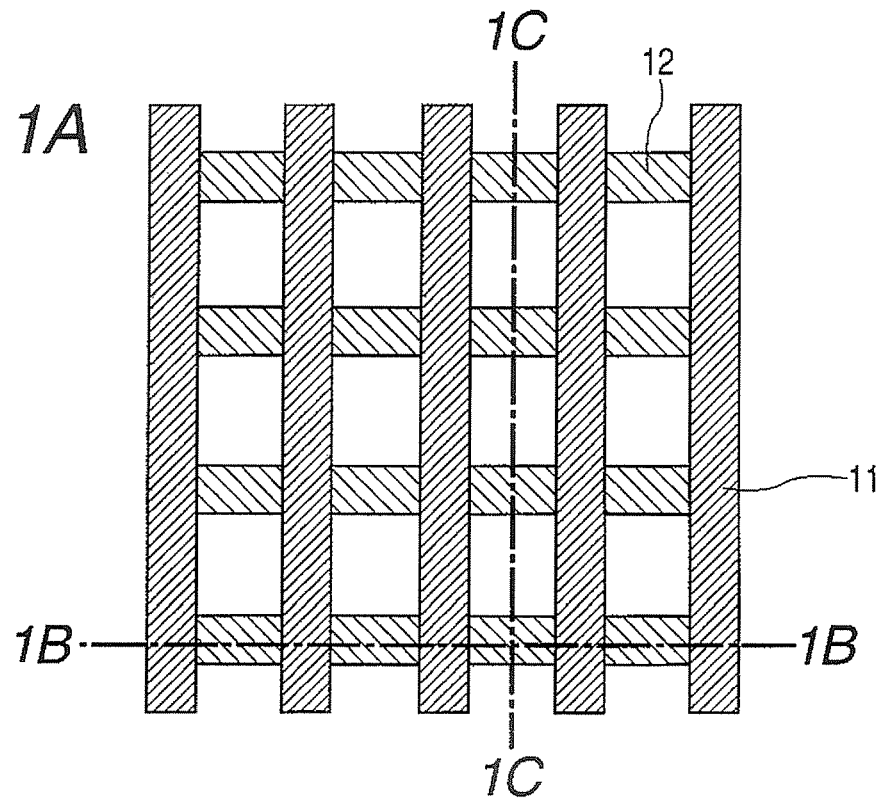
FIG. 1A is a schematic plan view illustrating an organic EL light-emitting device (Embodiment 1, Example 1) of the present invention.

The present invention provides an organic EL light-emitting device which is formed by applying an organic EL material by nozzle printing, and a production method thereof. In particular, the present invention provides an organic EL light-emitting device which also prevents crosstalk between same-color pixels of an organic EL material.

Specifically, the method of the present invention is for producing an organic EL light-emitting device having banks provided in a row direction and in a column direction, and a plurality of organic EL light-emitting portions isolated from each other by the banks. Further, the production method of the present invention comprises the steps of forming banks such that a height of a bank portion of a row direction and a height of a bank portion of a column direction are different from each other; and applying an organic EL material in a continuous manner along the bank portion which is higher of the bank portion of the row direction and the bank portion of the column direction, between the banks of the higher bank portion.

Further, the organic EL light-emitting device of the present invention comprises banks provided in a row direction and in a column direction, and a plurality of organic EL light-emitting portions isolated from each other by the banks, wherein a height of a bank portion of the row direction and a height of a bank portion of the column direction are different from each other.

The banks are provided between the plurality of organic EL light-emitting portions. In other words, the banks comprise a bank portion provided in a row direction and a bank portion provided in a column direction. When the light-emitting device has the organic EL light-emitting portions in a plurality of rows and a plurality of columns, the bank portions are also provided in a plurality of lines in both the row and the column directions. In the present invention, the height of the bank portion provided in the row direction is different from that of the bank portion provided in the column direction. The height at a location where the bank portion of the row direction and the bank portion of the column direction intersect each other is defined as the height of the bank portion which is higher of the both bank portions. In this regard, the term "height" herein employed refers to the distance from a surface of an electrode provided under the organic EL layer to a position which is most distant from the electrode.

The banks are formed so as to be provided between the plurality of organic EL light-emitting portions, in other words, so as to have the bank portions in the row and the column directions. The formation of the banks is carried out prior to the application of the organic EL materials. This is because the banks eventually bank the applied organic EL materials.

The organic EL light-emitting portions each have a pair of electrodes and an organic compound layer disposed therebetween. Thus, holes injected from the anode and electrons injected from the cathode are recombined in the organic compound layer, and when excited molecules return to a ground state, light is emitted. The organic compound layer contains at least a light-emitting layer, and may additionally contain other layers, such as a hole-transporting layer, an electron-transporting layer, a hole injection layer, or an electron injection layer.

The organic EL light-emitting portion is formed in plurality while being isolated from each other in the row and the column directions. The organic compound layers are each formed by continuous application of an organic EL material while being isolated from each other by the banks. The term "continuous application" herein employed refers, in particular, to applying an organic EL material linearly without any break. In this case, in order that a uniform film can be formed at the respective organic EL light-emitting portions, it is preferable that the relative positional relationship between a nozzle and a formed film-shaped member changes at a constant rate while ejecting a given amount of organic EL material from a nozzle. The terms "row direction" and "column direction" herein employed do not refer to "horizontal direction" and "vertical direction", respectively, in a display surface when the organic EL light-emitting device of the present invention is applied to a display device. However, description will be made below with the horizontal direction in the drawing being the "row direction" and with the vertical direction therein being the "column direction", for convenience of the description. Incidentally, it is to be noted that the "row direction" and the "column direction" do not necessarily need to intersect each other perpendicularly.

Formation of the organic EL light-emitting portions is carried out, by applying organic EL materials, in a state in which not only the bank portions parallel to the scanning direction (direction in which the relative positional relationship between the nozzle and a formed film-shaped member changes) but also the bank portions intersecting the scanning direction have been formed. Further, the latter bank portions are formed so as to have a smaller height than the former bank portions to thereby realize physical isolation of the same ink (organic EL material). In order to isolate inks of different colors (e.g., organic EL materials 64a and 64b, and organic EL materials 64b and 64c) from each other and to prevent color mixing, the heights of the bank portions parallel to the scanning direction need to be sufficiently larger than the thicknesses of films of applied ink. However, because it is sufficient for the bank portions intersecting with the scanning direction to provide isolation of a same-color ink (organic EL material), the heights of those bank portions may be just larger than the final thicknesses of films of the organic EL material. Further, in order to prevent the breakage of the continuity of a coating liquid from the nozzle, the lower the bank portions which intersect the scanning direction, the better.

When applying the organic EL materials, in the case of using a different organic EL material for each organic EL light-emitting portion of a different emission color (e.g., the organic EL materials 64a and 64b, and the organic EL materials 64b and 64c), the organic EL light-emitting portions of the same color are disposed linearly in the scanning direction. Therefore, the pixel arrangement of the organic EL light-emitting device obtained according to the production method of the present invention is the so-called stripe arrangement in which organic EL light-emitting portions of plural colors are periodically arranged linearly.

Hereinafter, embodiments of the present invention are described with reference to the attached drawings.

(Embodiment 1)

Figure 1B:
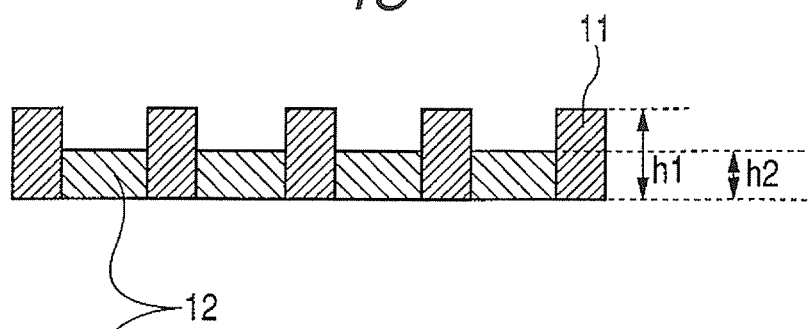
FIGS. 1B and 1C are cross-sectional views taken along lines 1B-1B and 1C-1C in FIG. 1A, respectively.
Figure 1C:
Figure 2A:
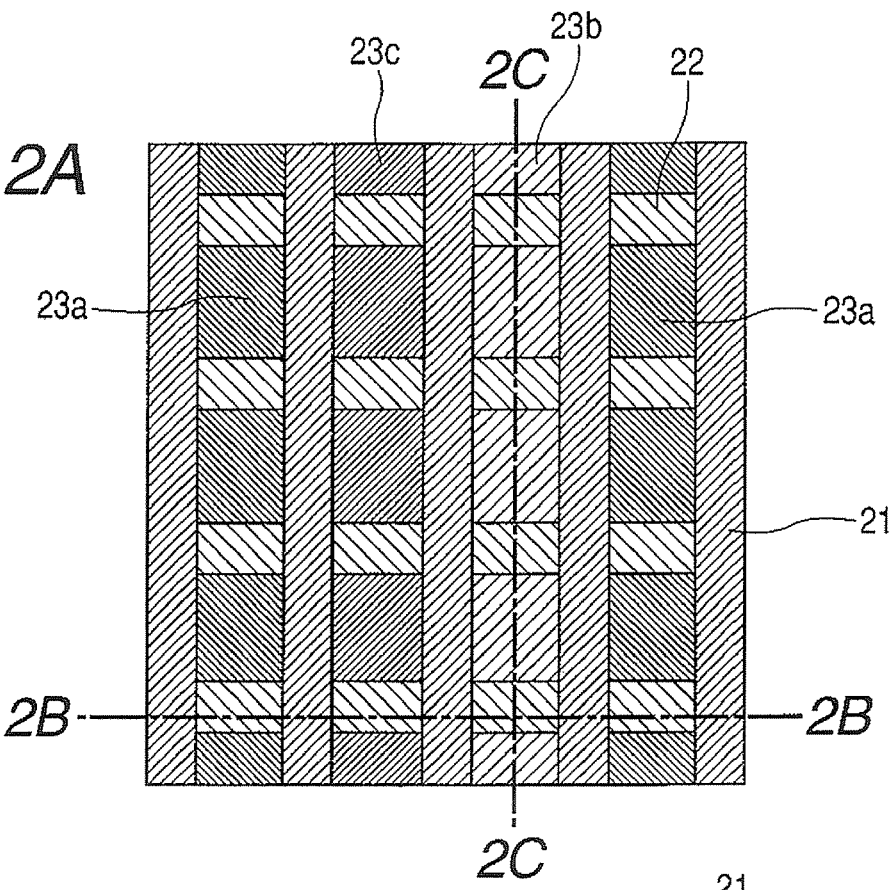
FIG. 2A is a schematic plan view illustrating the organic EL light-emitting device (Embodiment 1, Example 1) of the present invention.
Figure 2B:
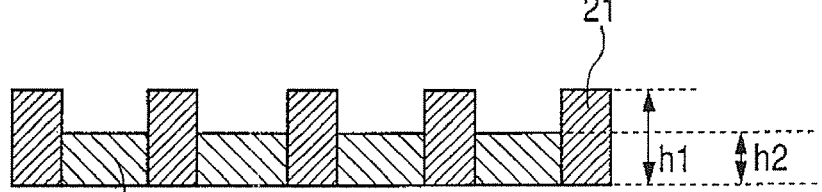
FIGS. 2B and 2C are cross-sectional views taken along lines 2B-2B and 2C-2C in FIG. 2A, respectively.
Figure 2C:
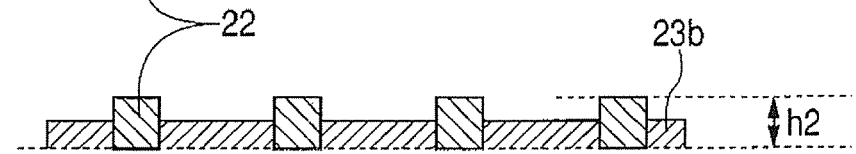

FIGS. 1A, 1B, and 1C are schematic views showing banks of an organic EL light-emitting device according to Embodiment 1 of the present invention. FIGS. 2A, 2B, and 2C are schematic views showing a state in which an organic compound layer is provided in each of areas defined by the banks of the organic EL light-emitting device, according to Embodiment 1 of the present invention. FIGS. 1A and 2A are plan views, and FIGS. 1B, 1C, 2B and 2C are cross-sectional views. In the organic EL light-emitting device of the present invention, electrodes are provided under the organic compound layer (back side of the drawing) and on the organic compound layer (front side of the drawing). However, in FIGS. 1A to 1C and FIGS. 2A to 2C, the devices are represented schematically with the electrodes being omitted for convenience of presentation. The organic EL light-emitting device of the present invention may be of the so-called passive matrix type in which striped electrodes intersect each other. Alternatively, the organic EL light-emitting device of the present invention may be of the so-called active matrix type in which one of the electrodes is defined for each organic EL light-emitting portion, and the other of the electrodes is provided so as to extend over the organic EL light-emitting portions.

In FIGS. 1A, 1B, and 1C, reference numeral 11 denotes bank portions of a column direction, and reference numeral 12 denotes bank portions of a row direction. In FIGS. 2A, 2B, and 2C, reference numeral 21 denotes bank portions of a column direction, reference numeral 22 denotes bank portions of a row direction, and reference characters 23a, 23b, and 23c denote organic EL layers for red, blue, and green, respectively.

As shown in FIGS. 1A to 1C and FIGS. 2A to 2C, Embodiment 1 of the present invention is an organic EL light-emitting device formed by applying organic EL materials by nozzle printing, and accordingly, bank portions parallel to the scanning direction are formed. Further, additional bank portions are also formed in a direction which intersects with the scanning direction. At this time, when the height of the bank portions parallel to the scanning direction is represented by "h1", and the height of the bank portions formed in the direction intersecting with the scanning direction is represented by "h2", the relationship of h1>h2 is satisfied. It is sufficient that the height "h2" of the bank portions formed in the direction intersecting the scanning direction provides isolation of an ink between the pixels in the scanning direction, and the mixing of the ink between adjacent pixels in the scanning direction causes no problem (because the same ink is used). Accordingly, the smaller the "h2", the better. However, the minimum value may only have to be equal to or more than the total thickness including the thicknesses of the organic EL layers and a cathode electrode. Specifically, the heights may, respectively, be as follows.

$1\ \mu m < h1 < 10\ \mu m;\ 0.1\ \mu m < h2 < 2\ \mu m$

The material of the banks may only have high electrical insulating properties. Preferable examples of the material include resins such as polyimide resin, polyester resin, styrene-acrylic copolymer resin, acrylic resin or the like; those materials obtained by adding an additive to the foregoing resin; and $SiO_2$. Further, it is also preferable that the surface of the bank is water-repellent, and that the inside of the bank, i.e., the region defined by the banks to serve as the organic EL light-emitting portion is hydrophilic so that ink (organic EL material) can be fixed thereto. For example, in the case where the bank is made of polyimide resin, after making the inside of the groove thereof hydrophilic by $O_2$ plasma treatment, the bank can be made water-repellent by $CF_4$ plasma treatment.

The method of making the heights of the banks different from each other between the column direction and the row direction is not particularly limited. However, when photolithography is used, two types of photomasks are provided, while a bank material is applied (or deposited) first to the entire surface, followed by further application of a photoresist onto the entire surface. Subsequently, the resultant is subjected to exposure for development for a predetermined period of time using a photomask masking those portions corresponding to the bank portions parallel to the nozzle scanning direction (bank portions of column direction), and then subjected to etching using the remaining resist as a mask for a predetermined period of time. Further, a photoresist is applied thereon, which is then subjected to exposure for a predetermined period of time for development using a photomask masking those portions corresponding to both of the bank portions parallel to the scanning direction (bank portions of column direction) and the bank portions intersecting the scanning direction (bank portions in row direction). Thereafter, etching is performed using the remaining resist as a mask for a predetermined period of time. As a result, the height of the bank portions of the row direction can be fabricated to be smaller than the height of the bank portions of the column direction (for details, see Example 1).

In another approach, a photomask is provided in which the width of each of those portions corresponding to the bank portions of the column direction is made larger than the width of each of those portions corresponding to the bank portions of the row direction. The resist remaining as a result of exposure-development using the mask has the following relation: (the width of the bank portion of the column direction)>(the width of the bank portion of the row direction).

Subsequently, when the bank material is etched using the remaining resist structure as a mask, polyimide banks having the following relation can be fabricated: (the width of the bank portion of the column direction)>(the width of the bank portion of the row direction).

The height of the banks at this moment is uniform at any position. Next, the surface of the device is heated to such a temperature as to soften the polyimide material, whereby the polyimide banks are softened. As a result, in the context of a difference in heat capacity, the height of the bank portions having the smaller width becomes smaller than that of the bank portions having the larger width. In this way, a device having the following relation can be obtained: (the height of the bank portion of the column direction)>(the height of the bank portion of the row direction).

Other approaches, such as those utilizing a change in transmittance of a photomask, or utilizing a phase-shift mask may also be used to achieve the same result.

(Embodiment 2)

Figure 3A:
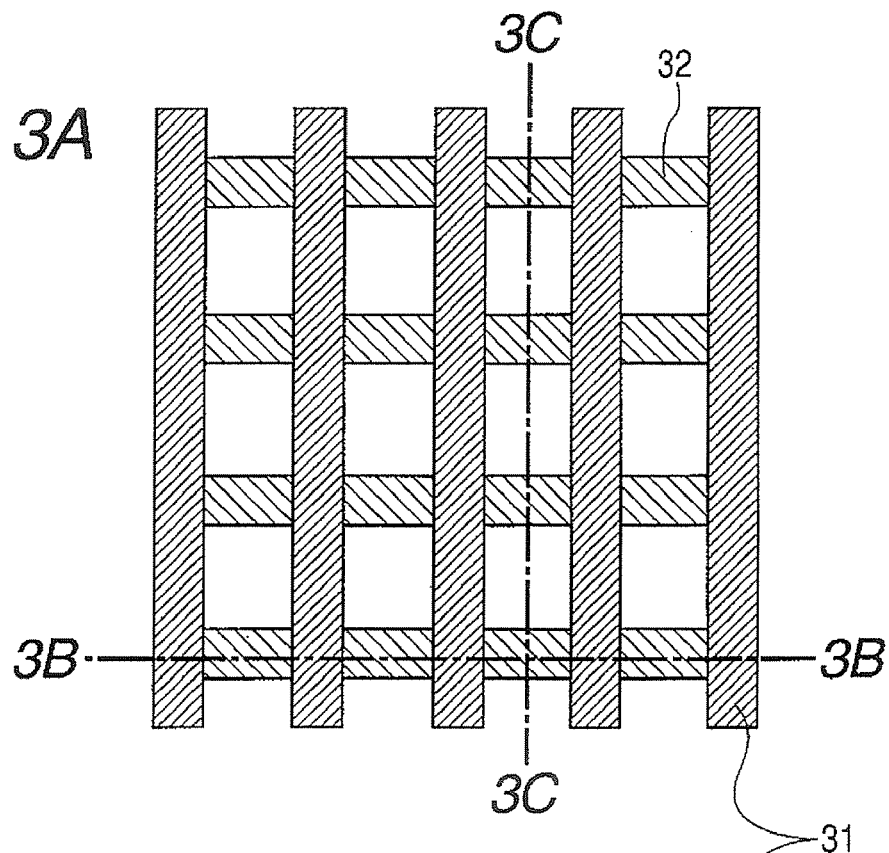
FIG. 3A is a schematic plan view illustrating an organic EL light-emitting device (Embodiment 2, Example 2) of the present invention.
Figure 3B:
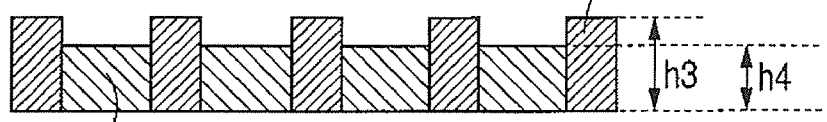
FIGS. 3B and 3C are cross-sectional views taken along lines 3B-3B and 3C-3C in FIG. 3A, respectively.
Figure 3C:
Figure 4A:
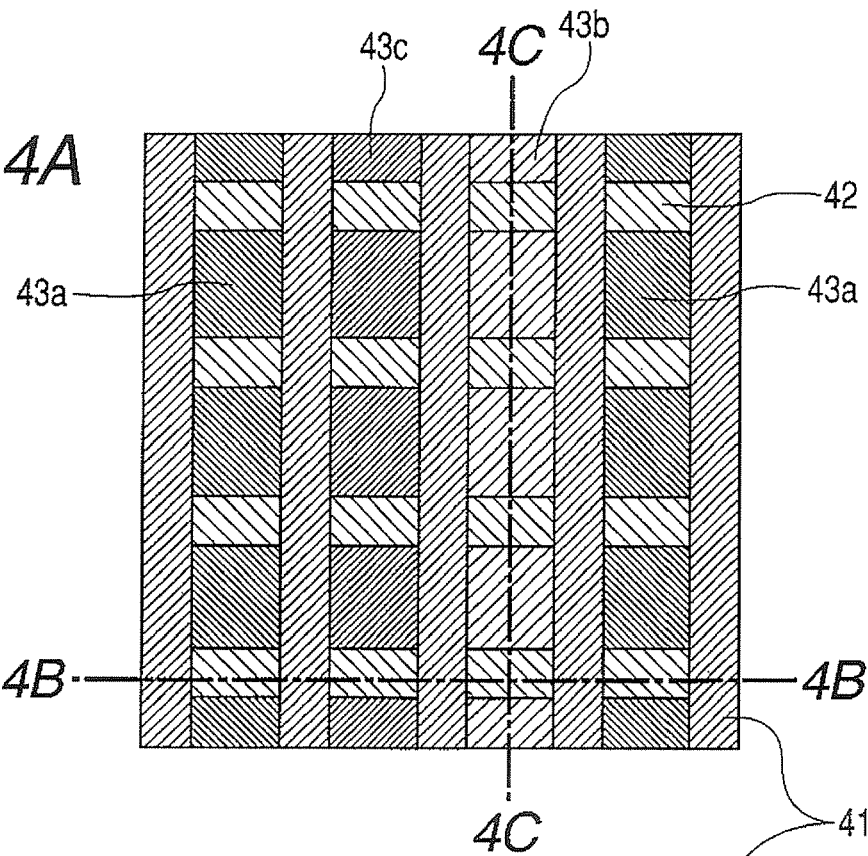
FIG. 4A is a schematic plan view illustrating the organic EL light-emitting device (Embodiment 2, Example 2) of the present invention.
Figure 4B:
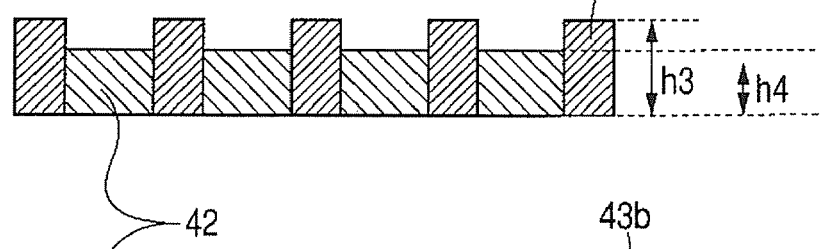
FIGS. 4B and 4C are cross-sectional views taken along lines 4B-4B and 4C-4C in FIG. 4A, respectively.
Figure 4C:

FIGS. 3A, 3B, and 3C are schematic views showing banks of an organic EL light-emitting device according to Embodiment 2 of the present invention. FIGS. 4A, 4B, and 4C are schematic views showing a state in which an organic compound layer is provided in each of areas defined by the banks of the organic EL light-emitting device, according to Embodiment 2 of the present invention. FIGS. 3A and 4A are plan views, and FIGS. 3B, 3C, 4B and 4C are cross-sectional views. In the organic EL light-emitting device of the present invention, electrodes are provided under the organic compound layer (back side of the drawing) and on the organic compound layer (front side of the drawing). However, in FIGS. 3A to 3C and FIGS. 4A to 4C, the devices are represented schematically with the electrodes being omitted for convenience of presentation.

In FIGS. 3A, 3B, and 3C, reference numeral 31 denotes bank portions of a column direction, and reference numeral 32 denotes bank portions of a row direction. In FIGS. 4A, 4B, and 4C, reference numeral 41 denotes bank portions of a column direction, reference numeral 42 denotes bank portions of a row direction, and reference characters 43a, 43b, and 43c denote organic EL layers for red, blue, and green, respectively.

In the organic EL light-emitting device according to Embodiment 2 of the present invention, which is formed by applying organic EL materials by nozzle printing, bank portions with a smaller height each have inclined surfaces in the longitudinal direction, in addition to the configuration of the device of Embodiment 1. In other words, the bank portions intersecting the scanning direction each have inclined surfaces in the longitudinal direction of the bank portions parallel to the scanning direction.

The term "having inclined surfaces" herein employed means, for example, that each of the banks has a triangular cross section as shown by the cross-sectional view of FIG. 3C which is taken along line 3C-3C in the scanning direction. In other words, where the height of the banks of the column direction is represented by "h3" and the height of the banks of the row direction is represented by "h4" as shown in FIG. 3B, the relation of h3≧h4 is satisfied, and further, as shown in FIG. 3C, the banks of the row direction each have a triangular cross section and each have no plane parallel to the bottom. In the present invention, the reason why the height "h4" of the bank portions of the row direction is made equal to or smaller than the height "h3" of the bank portions of the column direction is that the bank portions of the row direction are provided in order to give isolation of the ink of the same color and therefore that the same-color ink poses no problem of color mixing between adjacent pixels.

Accordingly, the smaller the "h4", the better. However, the minimum value may only have to be equal to or more than the total thickness including the thicknesses of the organic EL layers and a cathode electrode. Specifically, the heights may, respectively, be as follows.

$$1\ \mu m < h3 < 10\ \mu m;\ 0.1\ \mu m < h4 < 2\ \mu m$$

Further, for the purpose of accelerating isolation (or separation) of an ink (of the same color) into pixels in the column direction, the bank portions are each made to have a triangular cross section consisting of only inclined portions such as shown in FIG. 3C. No formation of a flat portion at the top of the bank portions can prevent the ink from remaining at the bank portions (conventional banks have a trapezoidal shape).

The technique of imparting a bank portion with a shape whose cross section is triangle is not particularly limited, but such banks may be fabricated by selecting resist materials or exposure conditions (defocused condition, for example). Alternatively, after forming banks of different widths, the banks may be deformed by etching or heat treatment. Alternatively, utilization of a change in transmittance of a photomask, or utilization of a phase-shift mask, for example, may achieve the same result.

As described above, according to the organic EL light-emitting device of the present invention, such measures are taken as making the height of the bank portions of a row direction smaller than that of the conventional bank portions of a column direction, or providing a structure in which the bank portions of the row direction have inclined surfaces, so that the continuity of dropping of a coating liquid, which is the characteristic of nozzle printing, is prevented from being impaired.

The method of fabricating bank portions of a row direction is achieved by only adding steps of the same level as those employed in the conventional fabrication method of bank portions of a column direction, without requiring particular steps or apparatuses, thereby avoiding increase of the production cost.

As described above, according to the present invention, complete isolation of an organic EL material into respective pixels can be ensured even when using nozzle printing. Accordingly, the present invention enables use of the coating process of nozzle printing to provide an organic EL light-emitting device. The organic EL light-emitting device of the present invention is applicable to display portions of, for example, digital cameras, television receivers, cellular phones, and PC monitors. Application of the organic EL light-emitting device of the present invention to such display portions can provide electronic devices of high display quality hardly causing crosstalk.

EXAMPLES

The present invention is described below referring to specific examples. However, the present invention is not limited to the examples.

Example 1

In the present example, an organic EL light-emitting device according to Embodiment 1 was produced.

First, a method of producing an organic EL light-emitting device using the conventional nozzle printing is described below with reference to FIG. 6 (cross sectional view) and FIG. 7 (plan view), each of which illustrates organic EL light-emitting portions of the organic EL light-emitting device.

Figure 8:
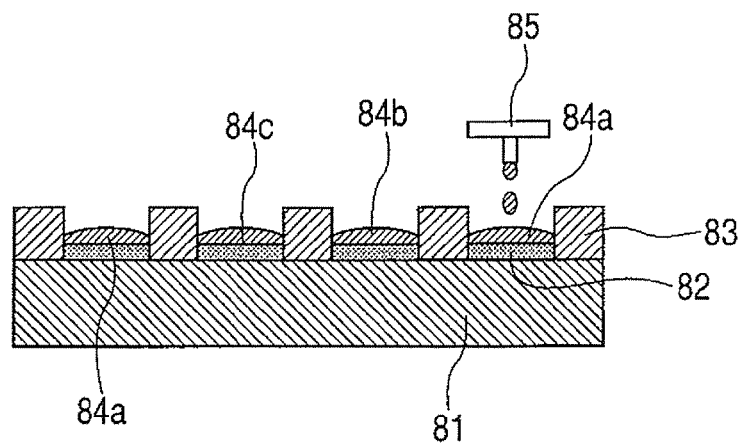
FIG. 8 is a schematic cross-sectional view illustrating formation of an organic EL device using an ink jet system.
Figure 9A:
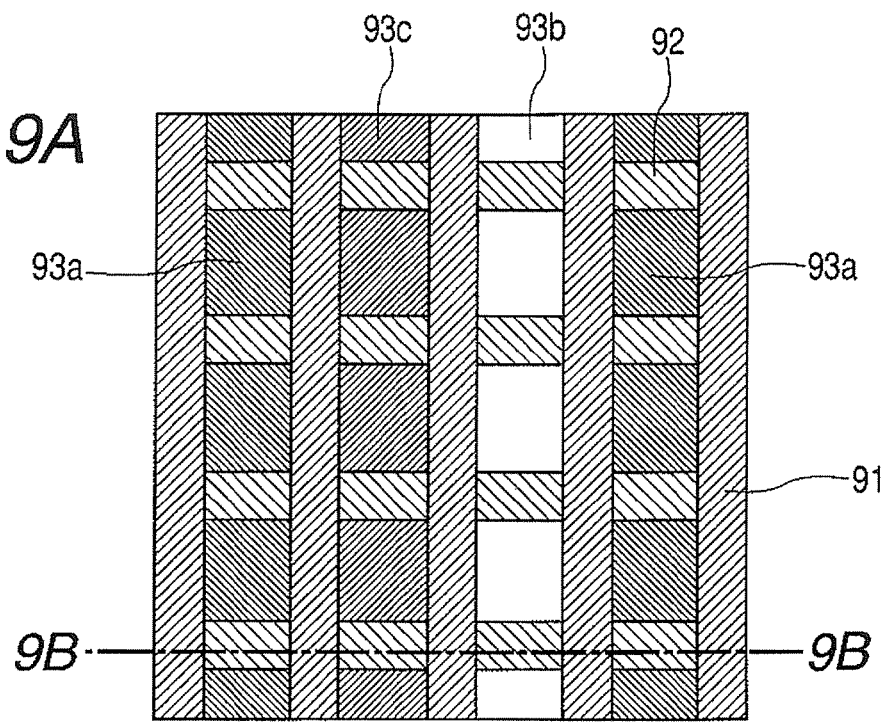
FIG. 9A is a schematic plan view illustrating formation of an organic EL device using an inkjet system.
Figure 9B:
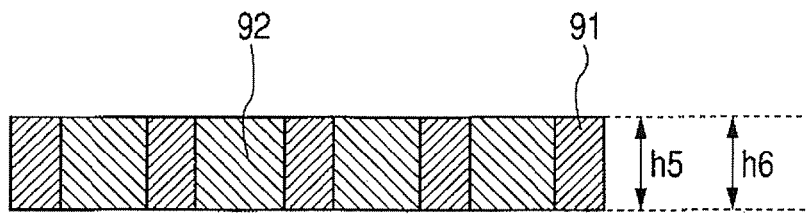
FIG. 9B is a cross-sectional views taken along line 9B-9B in FIG. 9A.

In the conventional nozzle printing process, organic EL layers, such as a hole injection layer and a light-emitting layer (red 64*a*, blue 64*b*, and green 64*c*) are formed between banks 63 by coating using a nozzle 65. At this time, the technique of continuously dropping a liquid ink (organic EL material, for example, 64) is adopted, so that the problem associated with the use of the conventional ink jet system such as shown in FIG. 8 that droplets of ink (organic EL material, for example, 84) go across the banks to be mixed into adjacent pixels is resolved.

Figure 7:
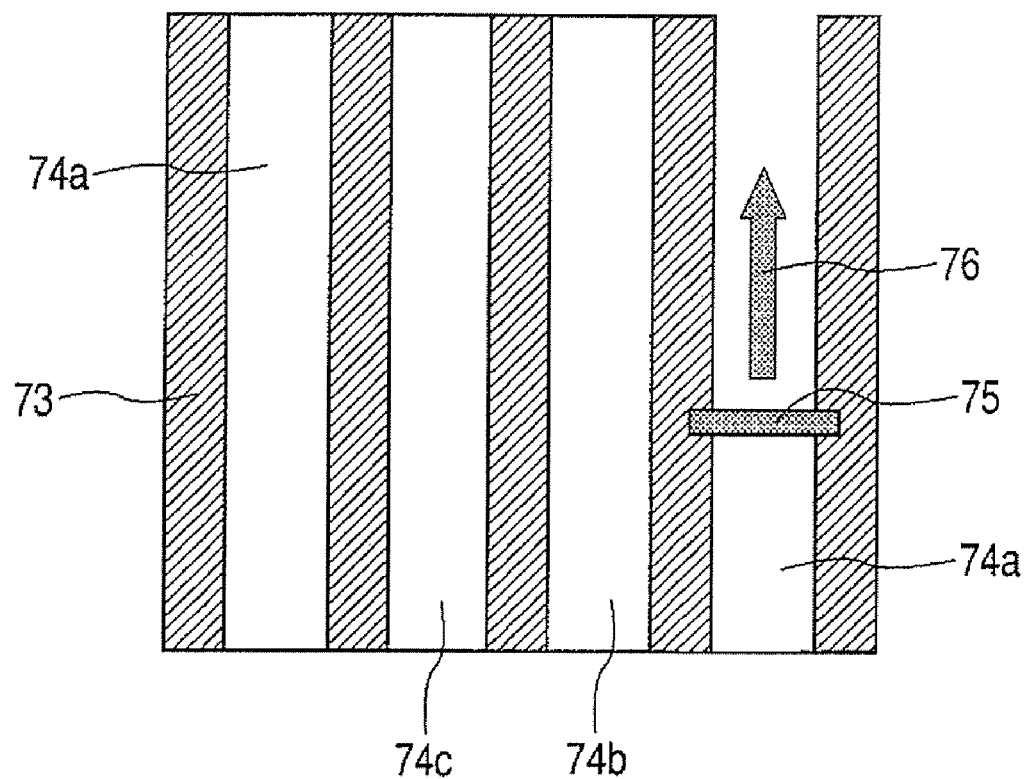
FIG. 7 is a schematic plan view illustrating formation of an organic EL device by nozzle printing.

However, as shown in FIG. 7, in the conventional nozzle printing process, banks 73 alone have been formed, which are parallel to the scanning direction 76, so that color separation of the organic EL layers 74*a*, 74*b*, and 74*c* has been performed.

In the present example, as shown in FIG. 1A, in addition to the conventional banks 11 parallel to the scanning direction (hereinafter referred to as "banks of a column direction"), banks 12 were also formed in a direction perpendicular to the scanning direction (hereinafter referred to as "banks of a row direction"). Here, as shown in FIG. 1B, when the height of the bank portions of the column direction is represented by "h1", and the height of the bank portions of the row direction is represented by "h2", the relationship of h1>h2 is ensured to be satisfied.

The banks were formed by using conventional photolithography and etching techniques. ITO was provided and patterned on a transparent substrate 61. Then, a 2 μm thick film of polyimide as the material of the banks 63 was formed entirely on the top surface thereof, followed by the application of a positive photoresist material (not shown) entirely on the surface thereof in a thickness of 2 μm.

Subsequently, the resultant was exposed using a photomask A shown in FIG. 5A. The photomask A has a mask portion 51 which does not transmit light and corresponds to the bank portions of the column direction. A portion of the resist not protected by the photomask A was dissolved and removed by development carried out after the exposure. Then, the polyimide was etched with the remaining resist material structure being used as a mask. At this time, the etched portion was ensured to have a depth of 0.5 μm.

Figure 5A:
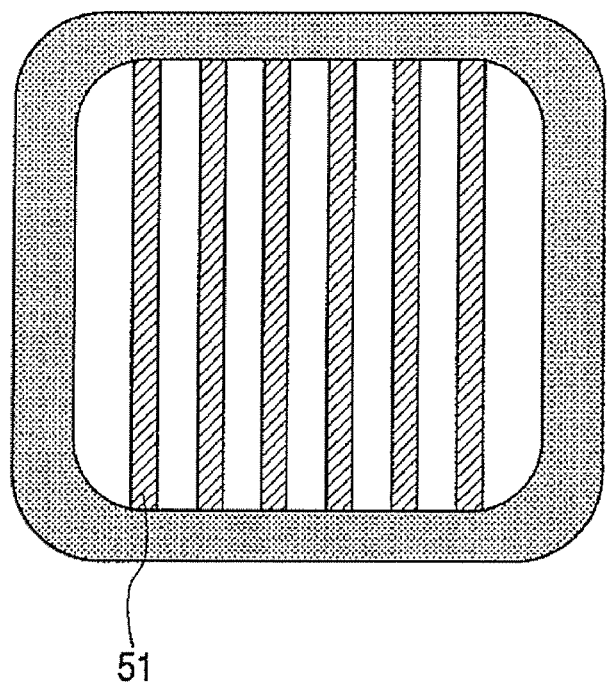
FIGS. 5A and 5B are schematic plan views illustrating the shapes of masks A and B used in forming banks of an organic EL light-emitting device of the present invention, respectively.
Figure 5B:
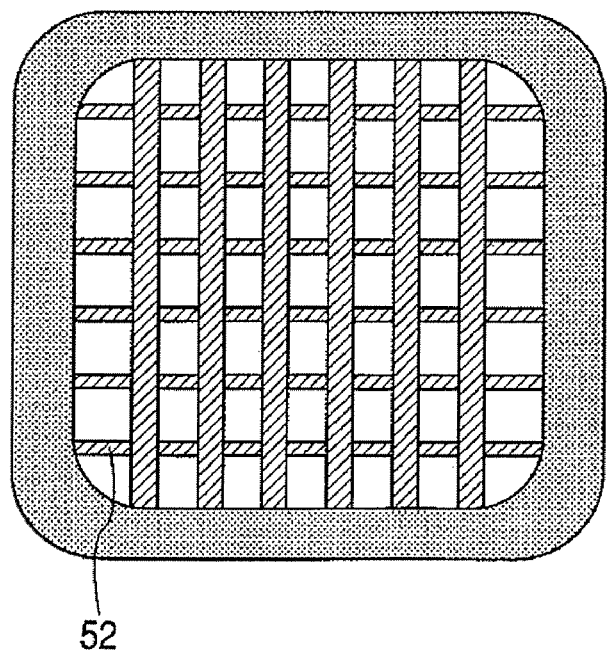

Then, the resultant was exposed using a photomask B shown in FIG. 5B. With the photomask B, light is shielded at a portion 52 which corresponds to the bank portions of both the column and the row directions. A portion of the resist not protected by the photomask B was dissolved and removed by development carried out after the exposure. Then, the polyimide was etched with the remaining resist material structure being used as a mask. The depth of the portion etched by this second etching was 1.5 μm.

Thus, the polyimide banks that were protected by both of the photomasks A and B and remained became the bank portions 11 of the column direction, with the height "h1" being 2 μm. On the other hand, the portion which was exposed by the photomask A but was not exposed by the photomask B became the bank portions 12 of the row direction, with the height "h2" being 1.5 μm. Further, the bank portions 11 of the column direction had a width of 20 μm and a pitch of 180 μm. The bank portions 12 of the row direction had a width of 20 μm and a pitch of 250 μm.

In this way, the structure having the polyimide banks as shown in FIGS. 1A and 1B was obtained.

Subsequently, $O_2$ plasma treatment was performed from above the top surface of the structure having the polyimide banks to make the entire surface hydrophilic. Then, only the polyimide bank portions are subjected to $CF_4$ plasma treatment to make only the bank portions water-repellent. By performing these procedures, there is obtained the effect that an organic EL material, which is in a form of a solution, is likely to be repelled by the bank portions and is likely to stay within the banks of the pixels (i.e. regions defined by the banks and serving as the organic EL light-emitting portions).

Figure 6:
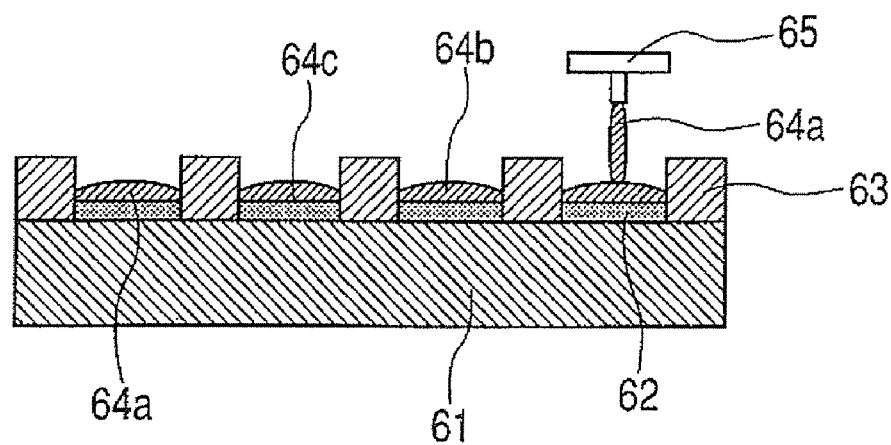
FIG. 6 is a schematic cross-sectional view illustrating formation of an organic EL device by nozzle printing.
Figure 10:
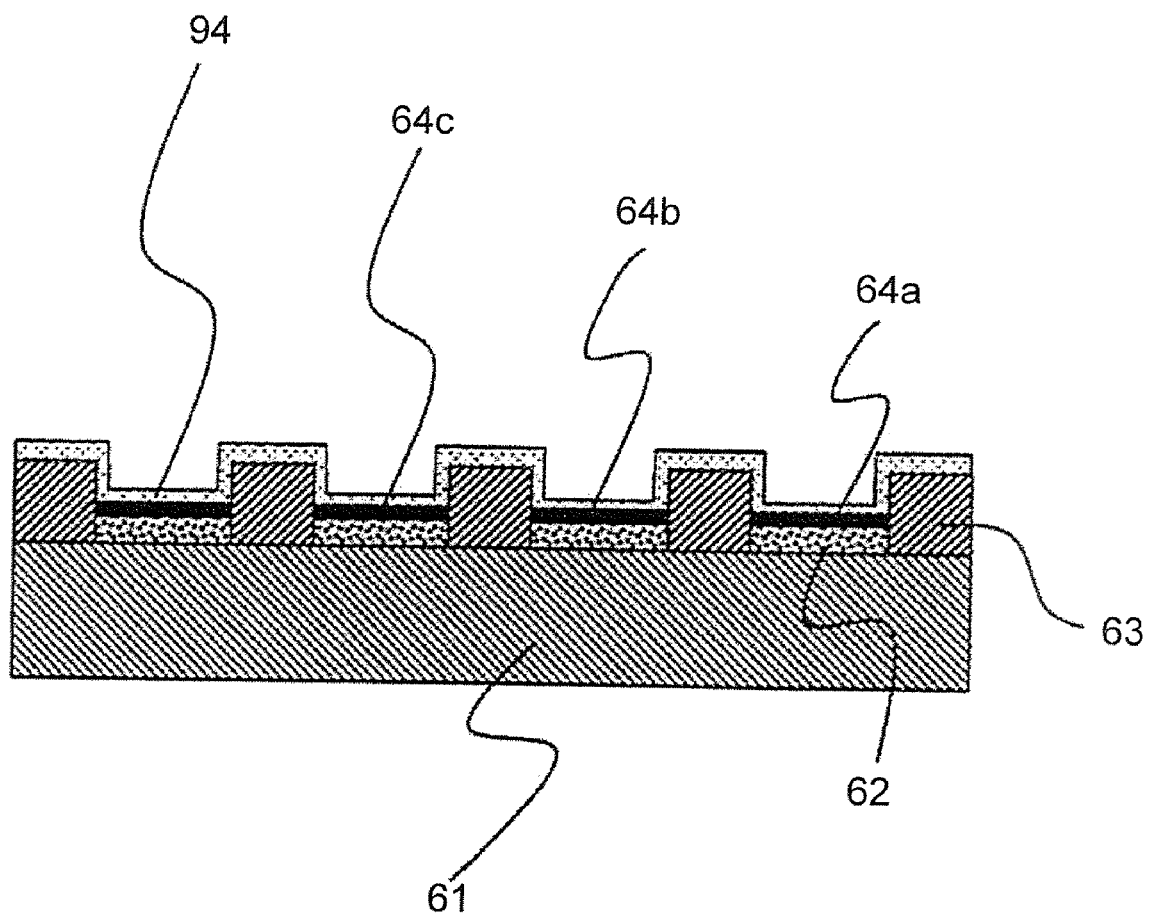
FIG. 10 is a schematic cross-sectional view illustrating formation of an organic EL device with a second electrode (cathode) continuously extending over a plurality of light-emitting portions which are adjacent to each other.

After that, the structure was used and subjected to stack coating with the organic EL materials 64*a*, 64*b*, and 64*c* using the conventional nozzle printing process such as shown in FIG. 6. After the organic solvent was dried, it was observed that as shown in FIGS. 2A to 2C, isolation of same-color ink was accomplished in the column direction for each of the organic EL layers 23*a*, 23*b*, and 23*c*, owing to the bank portions 22 of the row direction. Further, as shown in FIG. 10, after an Al electrode 94 was formed as a cathode electrode entirely on the top surface of each of the organic EL layers to perform encapsulation, the characteristics of the organic EL light-emitting device were evaluated, with the result that crosstalk was scarcely observed between adjacent pixels.

As described above, according to the present invention, provision of the low bank portions 22 in the row direction enables physical isolation between adjacent pixels in the scanning direction without impairing the continuity of application of ink of the nozzle printing. It was confirmed to be sufficient for the present invention that the bank portions 22 of the row direction had a height of at least 0.5 μm (while the bank portions of the column direction required a height of 2 μm or more).

Example 2

FIGS. 3A to 3C and FIGS. 4A to 4C show the organic EL light-emitting device according to Embodiment 2 of the present invention. FIGS. 3A and 4A are plan views, and FIGS. 3B, 3C, 4B and 4C are cross-sectional views.

In the present example, as shown in FIG. 3A, the bank portions 32 of the row direction were formed in addition to the conventional bank portions 31 of the column direction parallel to the nozzle scanning direction. Here, as shown in FIG. 3B, when the height of the bank portions 31 of the column direction is represented by "h3", and the height of the bank portions 32 of the row direction is represented by "h4", the relationship of h3>h4 is ensured to be satisfied. Further, as shown in FIG. 3C, the bank portions 32 of the row direction was each formed so as to have inclined surfaces, i.e., so as to have a triangular cross section and have no plane parallel to the bottom.

A method of fabricating banks and the shapes of the banks are described in detail below.

Conventional photolithography and etching processes were used for the fabrication of the banks.

Similarly as in Example 1, after forming an ITO 62 film, a polyimide film and a photoresist film on a transparent substrate 61, exposure/development was performed using the photomask B shown in FIG. 5B, followed by etching of the polyimide. The shapes of polyimide banks remaining after the etching were such that the width of the bank portion 31 of the column direction was 20 μm with the pitch thereof being 180 μm, the width of the bank portion 32 of the row direction was 5 μm with the pitch thereof being 200 μm, and the heights of the banks were all 3 μm. Then, appropriate conditions were selected to perform dry etching with respect to the surface of the light-emitting device. Generally, when dry etching is performed with respect to the surface of a surface structure (structure having unevenness in a surface thereof), plasma is concentrated to protruded portions (polarized portions) of the structure to deform the structure. By utilizing this phenomenon, in the present example, it was possible to accelerate deformation of the bank portions having the smaller width. Specifically, the bank portions 32 of the row direction after the dry etching each had a width of 5 μm and a pitch of 200 μm and each presented a triangular cross section such as shown in FIG. 3C with a height h4 of 1 μm. On the other hand, the shapes of the bank portions 31 of the row direction was hardly changed by the dry etching, and had a width of 20 μm, a pitch of 180 μm, and a height of 3 μm.

In this way, a structure having the banks such as shown in FIGS. 3A to 3C was obtained, and the surface shape thereof was such that the relation of h3>h4 was satisfied and the bank portions of the row direction presented a shape having no plane parallel to the bottom, i.e., a triangular cross section.

Subsequently, similarly as in Example 1, O₂ plasma treatment was performed from above the top surface of the structure having the polyimide banks to make the entire surface hydrophilic. Then, only the polyimide bank portions are subjected to CF₄ plasma treatment to make only the bank portions water-repellent. These procedures are performed in order to obtain the effect that an organic EL material, which is in a form of a solution, is likely to be repelled by the bank portions and is likely to stay within the banks of the pixels (i.e. regions defined by the banks and serving as the organic EL light-emitting portions).

After that, the structure was subjected to stack coating with the organic EL materials 64a, 64b, and 64c using the conventional nozzle printing process such as shown in FIG. 6. After the organic solvent was dried, it was observed that as shown in FIGS. 4A to 4C, isolation of same-color ink was accomplished in the column direction for each of the organic EL layers 43a, 43b, and 43c, owing to the bank portions 42 of the row direction. Further, as shown in FIG. 10, after an Al electrode was formed as a cathode electrode 94 entirely on the top surface of each of the organic EL layers 43a, 43b, and 43c to perform encapsulation, the characteristics of the organic EL light-emitting device were evaluated, with the result that crosstalk was scarcely observed between adjacent pixels.

As described above, according to the present invention, provision of the low bank portions 42 in the row direction enables physical isolation between adjacent pixels in the scanning direction without impairing the continuity of application of ink of the nozzle printing. It was confirmed to be sufficient for the present invention that the bank portions 42 of the row direction had a height of at least 1 μm (while the bank portions of the column direction required a height of 3 μm or more).

Comparative Example 1

An organic EL light-emitting device was produced by following the same procedure as in Example 1 with the exception that no bank portion of a row direction was formed, and that the mask used for the photolithography was only the one shown in FIG. 5A. According to the present comparative example, the organic EL device formed by the nozzle printing process had the structure shown in FIG. 7.

Next, similarly as in Example 1, the characteristics of the thus produced light-emitting device were evaluated, with the result that crosstalk was generated between adjacent pixels made of light-emitting layers of the same color and that the luminance was lower.

In other words, in the organic EL light-emitting device of the present comparative example, the problem of generation of crosstalk between same-color light-emitting layers in the column direction was posed because no bank of a row direction was present.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent application No. 2005-358619 filed on Dec. 13, 2005, 2006-271542 filed on Oct. 3, 2006, which are hereby incorporated by reference herein.

What is claimed is:

1. A method of producing an active matrix organic light-emitting device comprising a plurality of organic light-emitting portions, the method comprising:
 forming a plurality of first electrodes corresponding to the plurality of organic light-emitting portions;
 forming banks for isolating the plurality of organic light-emitting portions from each other, the banks comprising a bank portion of a row direction, a bank portion of a column direction, and a bank portion at an intersection of the row direction and the column direction, and the bank portion of the column direction and the bank portion at the intersection are higher than the bank portion of the row direction;
 applying an organic EL material to the organic light-emitting portions in a continuous manner along the column direction;
 drying the applied organic EL material to form an organic El layer;
 forming a second electrode on the organic EL layer,
 wherein a height of a surface of the second electrode in the organic light-emitting portion is smaller than or equal to a height of a surface of the bank portion of the row direction, and
 wherein the second electrode is continuously formed so as to continuously extend over the plurality of light-emitting portions which are adjacent to each other in the row direction and in the column direction.

2. The method of producing an active matrix organic light-emitting device according to claim 1, wherein the step of forming banks comprises:
 providing a bank material on a plurality of first electrodes so as to continuously extend over the plurality of organic light-emitting portions which are adjacent to each other in the row direction and in the column direction;
 etching the bank material provided on the plurality of first electrodes and between the first electrodes, in the row direction; and
 further etching the bank material provided on the plurality of first electrodes to expose the first electrodes.

3. The method of producing an active matrix organic light-emitting device according to claim 1, wherein the height of the bank portion of the column direction is more than 1 μm and less than 10 μm, and the height of the bank portion of the row direction is more than 0.1 μm and less than 2 μm.

* * * * *